United States Patent [19]

Farries et al.

[11] Patent Number: 5,163,058
[45] Date of Patent: Nov. 10, 1992

[54] SEMICONDUCTOR LASER PUMP SOURCE

[75] Inventors: Mark C. Farries; Andrew C. Carter, both of Northants, England

[73] Assignee: The General Electric Company, p.l.c, England

[21] Appl. No.: 706,985

[22] Filed: May 29, 1991

[30] Foreign Application Priority Data

Jun. 1, 1990 [GB] United Kingdom ............... 9012242

[51] Int. Cl.$^5$ ............................................. H01S 3/30
[52] U.S. Cl. .................................... 372/6; 372/71
[58] Field of Search ........................ 372/6, 70, 71, 75

[56] References Cited

U.S. PATENT DOCUMENTS

| | | | |
|---|---|---|---|
| 4,780,877 | 10/1988 | Snitzer | 372/6 |
| 4,901,330 | 2/1990 | Wolfram et al. | 372/75 |
| 5,008,887 | 4/1991 | Kafka et al. | 372/6 |
| 5,022,042 | 6/1991 | Bradley | 372/75 |
| 5,048,026 | 9/1991 | Shaw et al. | 372/6 |

Primary Examiner—John D. Lee
Assistant Examiner—Robert E. Wise
Attorney, Agent, or Firm—Kirschstein, Ottinger, Israel & Schiffmiller

[57] ABSTRACT

A laser source for pumping an optical device which requires for its operation a significant amount of light power, the source comprising a semiconductor array (11) for providing a plurality of spaced apart light beams at different wavelengths, an optical assembly (14, 15, 16) for focussing the light beams into an optical waveguide (19), the optical waveguide (19) being coupled to the optical device.

14 Claims, 1 Drawing Sheet

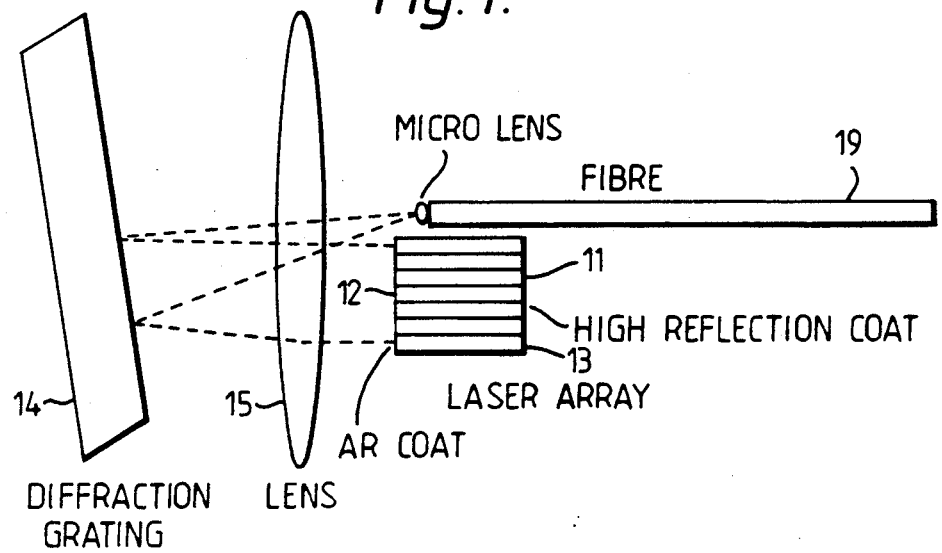
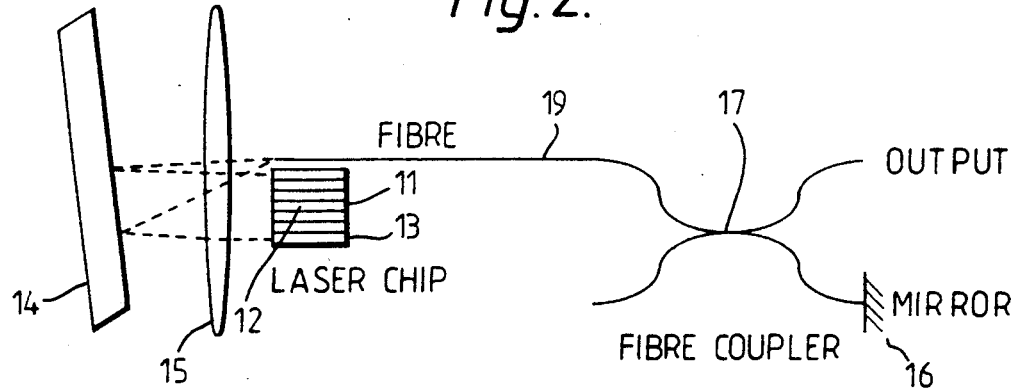
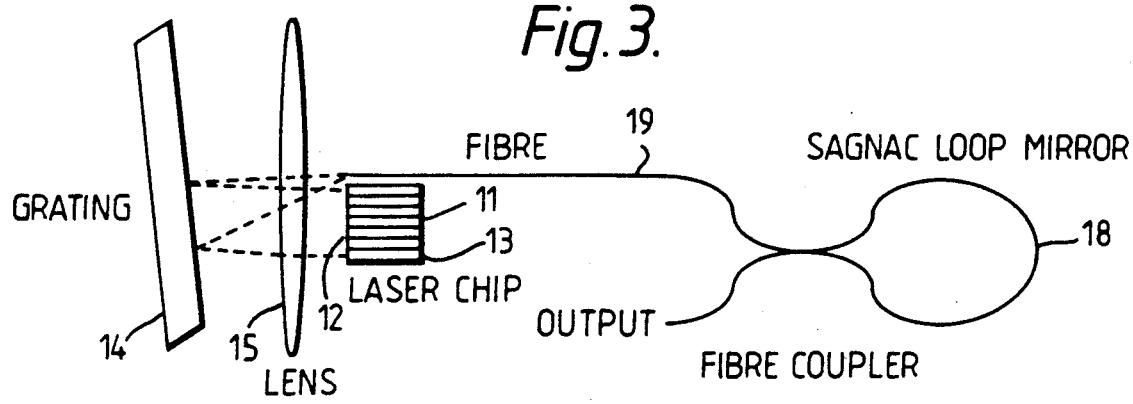

SEMICONDUCTOR LASER PUMP SOURCE

FIELD OF THE INVENTION

This invention relates to a semiconductor laser source which can produce relatively high powers, say of the order of 100 mW, for coupling into devices which require such high powers for their operation, such as optical amplifiers.

BACKGROUND ART

Fibre optical amplifiers comprising Erbium doped single mode optical fibres, are seen as vital components for future optical communication systems require pumping with high optical powers. Coupling power of the order of 100 mW into a single mode optical fibre from a semiconductor laser is difficult to achieve. This power level is not readily achievable from reliable long lived single lasers operating in monomode, which commonly provide only about 10 mW. One solution which has been applied is multiplexing two orthogonally polarised lasers with a polarisation beam splitter. However this solution only couples the power of two lasers into the fibre. Powers of up to 100 mW are required to pump fibre amplifers.

SUMMARY OF THE INVENTION

It is an object of the present invention to provide a source of semiconductor laser power which can reliably provide relatively high power and which is capable of coupling the light into monomode optical fibre.

The basis of the present invention is to provide several lasers at slightly different wavelengths and to couple the laser beam into the optical fibre by means of an optical focussing or multiplexing arrangement. Many individual lasers with wavelength multiplexers would be cumbersome and expensive, but a multi-wavelength source based on a laser array and an external dispersive cavity may provide an efficient pump for erbium fibres.

In accordance with the invention, there is provided a laser source for pumping an optical device which requires for its operation a significant amount of light power, the source comprising a semiconductor means for providing a plurality of spaced apart light beams at different wavelengths, an optical assembly for focussing the light beams into an optical waveguide, the optical waveguide being coupled to said optical device.

In a preferred form, a laser source is employed of the type described and claimed in our copending application GB-A-2,202,404, namely an apparatus for optical wavelength division multiplexing, apparatus of the type comprising:

an optical assembly for collimating, dispersing, and focusing light;

one laser, at least, effectively located at or near a focus of this assembly; and, an optical waveguide, located at or near a common and conjugate focus of this assembly and arranged thus to receive light emitted from said one laser, wherein, the optical waveguide is adapted by the provision of reflection enhancement means so as to reflect light emitted by said one laser and to control thereby the resonant emission thereof.

Whilst as described in GB-A-2,202,404, the laser source is primarily intended as a form of frequency or wavelength multiplexing for increasing the information carrying capability of the source, in the present invention, the source is primarily used as a means of increasing the power which can be coupled into a monomode fibre arrangement.

In certain circumstances it may be desired to couple light in accordance with the invention into multimode fibre having a wider core. However the present invention is particularly intended for use with monomode fibre having a narrow core (say 10 $\mu$m).

The optical device requiring pumping may be a fibre laser, fibre switch, optical amplifier, or sensor device. In the case of an optical amplifier the amplifier may be an integrated optical device or a doped optical fibre. As preferred Erbium doped fibre amplifiers are employed, requiring pumping at about 100 mW and used as preamplifiers, regenerators, power amplifiers.

A further problem which arises with a laser source employing an external laser cavity is that the light from the semiconductor source has previously been reflected back to this source from a reflective region formed at the end of the optical waveguide (fibre). It is difficult to form a reliable and accurate reflective region in this way.

To overcome this problem, in a second aspect the present invention provides a laser source comprising a semiconductor means for providing a plurality of spaced apart light beams at different wavelengths, an optical assembly for focussing the light beams into an end of an optical waveguide, said optical assembly including reflection means for forming a laser cavity external of said semiconductor means so that the light emitted by said semiconductors means is reflected to control resonant emission, the reflection means comprising a mirror means coupled to the optical waveguide by coupling means at a point remote from said end of the optical waveguide.

BRIEF DESCRIPTION OF THE DRAWINGS

Preferred embodiments of the invention will now be described with reference to the accompanying drawings, wherein:

FIG. 1 is a schematic view of a first embodiment of the invention;

FIG. 2 is a schematic view of a second embodiment of the invention; and,

FIG. 3 is a schematic view of a third embodiment of the invention.

DESCRIPTION OF THE PREFERRED EMBODIMENTS

The invention is described with reference to FIGS. 1 to 3. The laser source is an array of lasers 11 which will preferably be fabricated on a single substrate. Each laser is defined by a stripe and is insulated from its neighbour by a suitable well. The front end of the laser chip has an antireflection coating 12 to prevent oscillation and the back end has a high reflection coating 13. The laser cavity is formed by the back facet of the array 11 and the reflector in the external cavity. A dispersive element, which is preferably a diffraction grating 14, is placed in the cavity such that the feedback from the reflector to each laser element is at a different but well defined wavelength. In such a configuration each element of the laser array 11 will oscillate at a different wavelength which is determined by the position of the reflector, the diffraction and position of the grating 14 and also the position and power of the lens 15. The reflector may be a mirror as shown in FIG. 1 or a partially reflecting splice as described in the original patent. Alternatively the reflector could be formed by a mirror 16 placed on the end of an arm of a fibre coupler 17, the output being taken from the coupler's other arm as shown in FIG. 2. A preferable solution which avoids the use of reflecting surfaces is to use a Sagnac loop mirror 18 as shown in FIG. 3. The loop mirror is formed by a fibre coupler with the two output arms spliced together. Depending on the coupling ratio a proportion of the laser output will be returned to the laser chip as feedback and a proportion will be passed to the output port.

A specific version of this invention which is applicable for pumping fibre amplifiers and lasers is described as follows. The primary absorption bands of Erbium doped optical fibre which may be pumped by semiconductor lasers are at wavelengths of 670 nm, 807 nm, 980 nm and 1490 nm. The preferable pump bands are 980 nm and 1490 nm due to their absence of excited state absorption and large absorption cross sections. Both of these bands have significant pumpable absorption over linewidths of 20 nm.

The multi-wavelength source described above can be specifically tailored to provide simultaneous pumping at many wavelengths in either band. In the case of a laser for pumping the 980 nm band the laser chip will preferably be a GaInAs/GaAs quantum well laser array. The array will have stripes which define the laser regions and at a spacing of 5 to 10 $\mu$m. With an external cavity consisting of a 10 mm focal length lens and a 1200 lines/mm diffraction grating a wavelength spacing of approximately 0.4 mm will be achieved between stripe channels. An array of 50 laser stripes will produce a source which will pump across the 20 nm absorption band.

In the case of the 1490 laser the chip will preferably by a GaInAsP/InP laser array. The longer wavelength requires a diffraction grating of 900 or 600 lines/mm. An array of 25 laser stripes with a wavelength spacing of 0.8 nm will cover the absorption band from 1475 nm to 1495 nm.

There are additional advantages of these sources for fibre amplifier pumping. The wavelength dependence of the gain between 1500 nm and 1550 nm is known to be dependent on the pump wavelength due to selective excitation of certain ion sites. Pumping with a range of wavelengths will ensure that all the erbium ions are excited and a uniform gain spectrum is produced. Secondly the control of the pump wavelength at 1490 nm is very important in order to prevent pump light interfering with the signal. The external cavity ensures that the pump wavelengths are kept in the pump band and do not drift. A greatly enhanced reliability may be expected from the wavelength multiplexed pump source in that the individual elements are operating at only relatively low power and failure of even half of the elements would still result in a usable pump source.

We claim:

1. A laser pump source for pumping an optical device which requires for its operation a significant amount of light power, the source comprising a semiconductor laser array for emitting a plurality of spaced apart light beams at different wavelengths, and an optical assembly for forming a laser cavity external of said laser array and for focussing the emitted light beams into an optical waveguide, the optical waveguide being coupled to said optical device.

2. A laser source as claimed in claim 1, wherein the optical device is selected from the group consisting of a fibre laser, a fibre switch and an optical amplifier.

3. A laser source as claimed in claim 2, wherein the optical device comprises an amplifier which is constituted by an Erbium doped monomode optical fibre.

4. A laser source as claimed in claim 1, wherein the semiconductor array comprises a single integrated device having a layered structure.

5. A laser source as claimed in claim 1, wherein said optical assembly includes reflection means for forming the laser cavity external of said semiconductor means so that the light beams emitted by said semiconductor array is reflected to control resonant emission.

6. A laser source as claimed in claim 5, wherein the reflection means comprises reflection enhancement means associated with the optical waveguide.

7. A laser source as claimed in claim 5, wherein the reflection means comprises a reflective mirror coupled to the optical waveguide by means of a coupling device comprising spaced apart waveguide arms.

8. A laser source as claimed in claim 5, wherein the reflection means comprises a fibre loop mirror coupled to the optical waveguide.

9. A laser source as claimed in claim 1, wherein the optical waveguide comprises monomode optical fibre.

10. A laser source as claimed in claim 1, wherein the optical assembly includes a diffraction means coupled to said semiconductor array and said optical waveguide by collimating and focussing means.

11. A laser pump source comprising a semiconductor laser array for emitting a plurality of spaced apart light beams at different wavelengths, an optical assembly for focussing the light beams into an end of an optical waveguide, said optical assembly including reflection means for forming a laser cavity external of said semiconductor array so that the light beams emitted by said semiconductor array is reflected to control resonant emission, the reflection means comprising a mirror means coupled to the optical waveguide by coupling means at a point remote from said end of the optical waveguide.

12. A laser source as claimed in claim 11, wherein the reflection means comprises a reflective mirror coupled to the optical waveguide by means of the coupling means comprising spaced apart waveguide arms.

13. A laser source as claimed in claim 11, wherein the reflection means comprises a loop mirror coupled to the optical waveguide.

14. A laser source as claimed in claim 11, wherein the optical assembly includes diffraction means coupled to said semiconductor array and said optical waveguide by collimating and focussing means.

* * * * *